(12) United States Patent

Shounai et al.

(10) Patent No.: US 12,695,470 B2

(45) Date of Patent: Jul. 28, 2026

(54) RADIO FREQUENCY CIRCUIT AND COMMUNICATION DEVICE

(71) Applicant: Murata Manufacturing Co., Ltd., Nagaokakyo (JP)

(72) Inventors: Hiroki Shounai, Nagaokakyo (JP); Kenji Tahara, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 316 days.

(21) Appl. No.: 18/625,227

(22) Filed: Apr. 3, 2024

(65) Prior Publication Data

US 2024/0275412 A1 Aug. 15, 2024

Related U.S. Application Data

(63) Continuation of application No. PCT/JP2022/037609, filed on Oct. 7, 2022.

(30) Foreign Application Priority Data

Oct. 22, 2021 (JP) ................................. 2021-173410

(51) Int. Cl.
| | |
|---|---|
| *H04B 1/00* | (2006.01) |
| *H03F 1/56* | (2006.01) |
| *H03F 3/24* | (2006.01) |

(52) U.S. Cl.
CPC ............... *H04B 1/006* (2013.01); *H03F 1/56* (2013.01); *H03F 3/245* (2013.01); (Continued)

(58) Field of Classification Search
CPC . H04B 1/006; H03F 1/56; H03F 3/245; H03F 2200/171; H03F 2200/387; H03F 2200/451
See application file for complete search history.

(56) References Cited

U.S. PATENT DOCUMENTS

| | | | | |
|---|---|---|---|---|
| 12,176,853 | B2 * | 12/2024 | Chatterjee | ............... H03F 3/213 |
| 2005/0245201 | A1 * | 11/2005 | Ella | ........................ H04B 1/406 |
| | | | | 455/272 |

(Continued)

FOREIGN PATENT DOCUMENTS

| | | | |
|---|---|---|---|
| JP | 2016-501503 | A | 1/2016 |
| JP | 2018-137566 | A | 8/2018 |

(Continued)

OTHER PUBLICATIONS

International Search Report and Written Opinion mailed on Dec. 27, 2022, received for International Application No. PCT/JP2022/037609, filed on Oct. 7, 2022, 08 pages including English Translation.

*Primary Examiner* — Junpeng Chen

(74) *Attorney, Agent, or Firm* — XSENSUS LLP

(57) ABSTRACT

A radio frequency circuit includes power amplifiers, an input side coil and an output side coil, a filter whose pass band is a first band, a filter whose pass band is a second band, a filter whose pass band is a third band, a switch connected between ground and a path connecting one end portion of the output side coil and the filter, a switch connected between the ground and a path connecting the other end portion of the output side coil and the filter, a switch arranged in series in the path in between the switch and the filter, and a switch arranged in series in the path connecting the filter and a path connecting the switch and the switch, wherein no switch is arranged in series in the path.

20 Claims, 7 Drawing Sheets

(52) U.S. Cl.
  CPC .. *H03F 2200/171* (2013.01); *H03F 2200/387*
  (2013.01); *H03F 2200/451* (2013.01)

(56) References Cited

U.S. PATENT DOCUMENTS

| | | | |
|---|---|---|---|
| 2007/0298731 A1 | 12/2007 | Zolfaghari | |
| 2009/0116510 A1* | 5/2009 | Georgantas | H04B 1/006 |
| | | | 370/467 |
| 2009/0163157 A1* | 6/2009 | Zolfaghari | H04B 1/0067 |
| | | | 455/127.1 |
| 2010/0194493 A1 | 8/2010 | Thompson | |
| 2016/0336631 A1* | 11/2016 | Lähteensuo | H01P 1/10 |
| 2018/0175798 A1* | 6/2018 | Cabanillas | H03F 3/211 |
| 2019/0319664 A1* | 10/2019 | Emira | H03K 17/002 |
| 2021/0006273 A1* | 1/2021 | Tahara | H04B 1/0057 |
| 2021/0218424 A1* | 7/2021 | Pehlke | H04B 1/0078 |
| 2023/0268944 A1* | 8/2023 | Uejima | H04B 1/006 |
| | | | 455/114.3 |

FOREIGN PATENT DOCUMENTS

| | | | |
|---|---|---|---|
| JP | 2020-096313 A | 6/2020 | |
| JP | 2021-061577 A | 4/2021 | |

* cited by examiner

FIG. 3A

AT TIME OF
TRANSMITTING BAND C

FIG. 3B

AT TIME OF TRANSMITTING
BAND A

RADIO FREQUENCY CIRCUIT AND COMMUNICATION DEVICE

CROSS-REFERENCE TO RELATED APPLICATIONS

This is a continuation application of PCT/JP2022/037609, filed on Oct. 7, 2022, designating the United States of America, which is based on and claims priority to Japanese Patent Application No. JP 2021-173410 filed on Oct. 22, 2021. The entire contents of the above-identified applications, including the specifications, drawings and claims, are incorporated herein by reference in their entirety.

TECHNICAL FIELD

The present disclosure relates to radio frequency circuits and communication devices.

BACKGROUND ART

Patent Document 1 discloses a power amplifying circuit that includes a first amplifier that amplifies a first signal divided from an input signal in a range where the power level of the input signal is equal to or higher than a first level and outputs a second signal, a first transformer to which the second signal is input, a second amplifier that amplifies a third signal divided from the input signal in a range where the power level of the input signal is equal to or higher than a second level that is higher than the first level and outputs a fourth signal, and a second transformer to which the fourth signal is input.

CITATION LIST

Patent Document

Patent Document 1: Japanese Unexamined Patent Application Publication No. 2018-137566

SUMMARY OF DISCLOSURE

Technical Problem

In the case where radio frequency signals of a plurality of bands are amplified and transmitted separately in the power amplifying circuit disclosed in the Patent Document 1, it is necessary to have, on the output side of the power amplifying circuit, a plurality of filters whose respective pass bands correspond to the plurality of bands and switches that switch between connecting and disconnecting the power amplifying circuit to and from the foregoing plurality of filters.

However, in the case where the foregoing switch is arranged in a signal path, the transmission loss of a radio frequency signal increases due to the ON-resistance of this switch.

The present disclosure is made to resolve the foregoing issue, and an object thereof is to provide a multiband radio frequency circuit and a multiband communication device, each having a plurality of amplifying elements and a transformer and being able to transmit radio frequency signals with low loss.

Solution to Problem

In order to achieve the foregoing object, a radio frequency circuit according to one aspect of the present disclosure includes: a first amplifying element and a second amplifying element; a transformer having an input side coil and an output side coil; a first filter having a pass band that includes a first band; a second filter having a pass band that includes a second band; a third filter having a pass band that includes a third band; a first switch connected between a first path and ground, the first path connecting one end portion of the output side coil and the first filter; a second switch connected between a second path and the ground, the second path connecting another end portion of the output side coil and the third filter; a third switch arranged in series in the first path in between the first switch and the first filter; and a fourth switch arranged in series in a third path connecting a path and the second filter, the path being part of the first path and connecting the first switch and the third switch, wherein no switch is arranged in series in the second path.

Advantageous Effects of Disclosure

According to the present disclosure, it becomes possible to provide a multiband radio frequency circuit and a multiband communication device, each having a plurality of amplifying elements and a transformer and being able to transmit radio frequency signals with low loss.

BRIEF DESCRIPTION OF DRAWINGS

FIG. 3A is a circuit state diagram of the radio frequency circuit according to the embodiment assuming a signal of band C is transmitted.

FIG. 3B is a circuit state diagram of the radio frequency circuit according to the embodiment assuming a signal of band A is transmitted.

DESCRIPTION OF EMBODIMENTS

Figure 1:
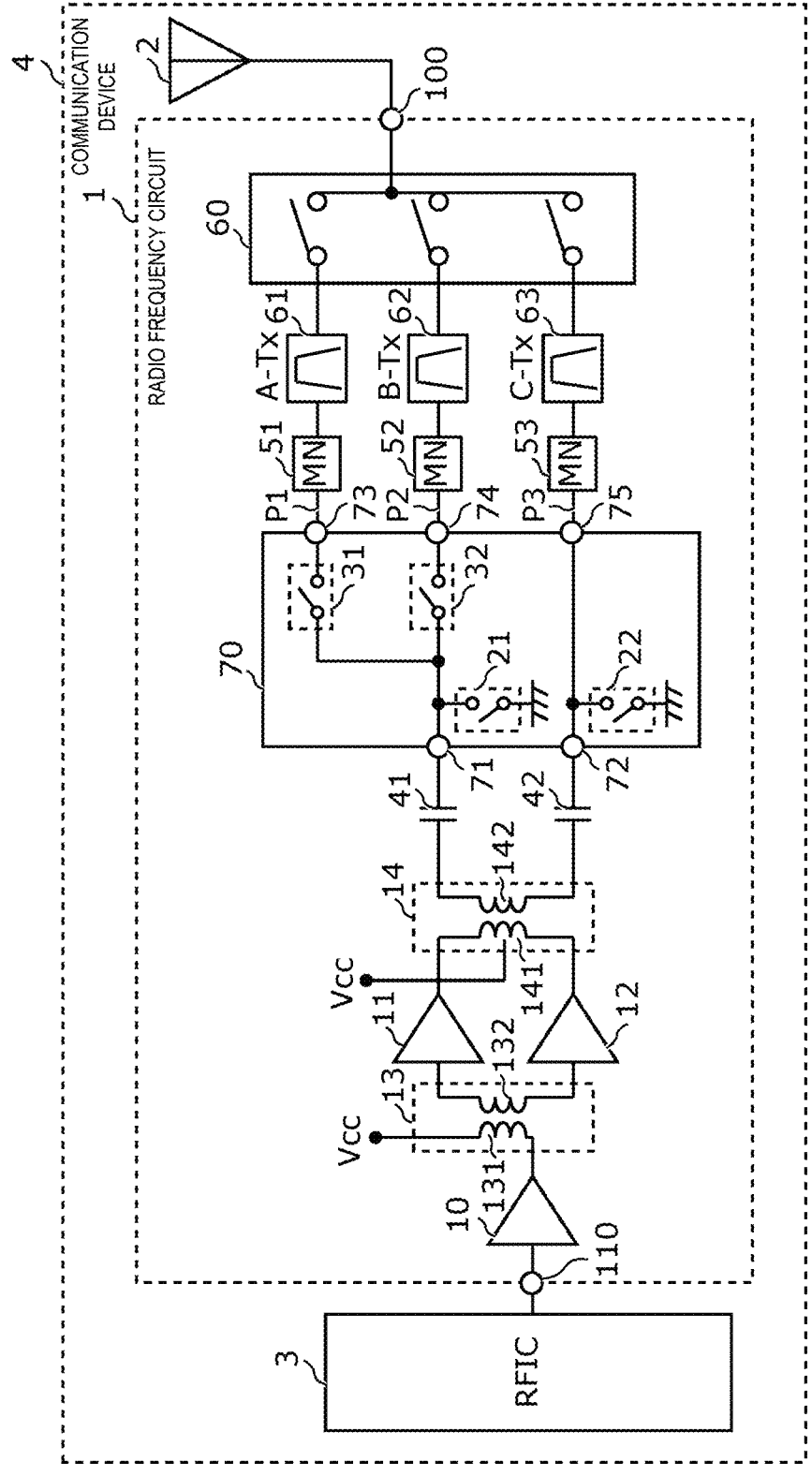
FIG. 1 is a circuit configuration diagram of a radio frequency circuit and a communication device according to an embodiment.

Hereinafter, embodiments of the present disclosure will be described in detail with reference to the drawings. Note that the embodiments, which will be described below, each illustrate a comprehensive or specific example. Numeric values, shapes, materials, constituent elements, arrangements and connection modes of the constituent elements, and the like illustrated in the following embodiments are mere examples, and not intended to limit the present disclosure.

Note that each drawing is a schematic diagram in which emphasis, omission, or ratio adjustment is performed assuming appropriate to illustrate the present disclosure and is not precisely drawn, and in some cases, the shape, spatial relationship, and ratio are different from the actual ones. In the drawings, the same reference characters are given to substantially the same constituent element, and in some cases, an overlapping description is omitted or simplified.

In the present disclosure, "being connected" is defined to mean to include not only the case of being directly connected by a connection terminal and/or a wiring conductor but also the case of being electrically connected via another circuit element. Further, "being connected in between A and B" and "being connected between A and B" are defined to mean to be connected to both A and B in a path connecting A and B.

Further, in the present disclosure, "path" is defined to mean to be a transmission line made up of a wiring line through which a radio frequency signal propagates, an electrode directly connected to this wiring line, a terminal directly connected to this wiring line or this electrode, and the like.

In the component layout of the present disclosure, "planar view" is defined to mean to see an object by orthographically projecting the object onto a x-y plane from the positive side of the z-axis. "A overlaps B in planar view" is defined to mean that the area of A that is orthographically projected onto the x-y plane overlaps the area of B that is orthographically projected onto the x-y plane. "A is arranged between B and C" is defined to mean that at least one of a plurality of lines each connecting an arbitrary point in B and an arbitrary point in C goes through A. "A is arranged closer to C than B" is defined to mean that the shortest distance between A and C is shorter than the shortest distance between B and C. Further, terms indicating relationships among constituent elements such as "parallel", "orthogonal", and the like, terms indicating shapes of constituent elements such as "rectangle" and the like, and numerical ranges are used not only to represent their precise meanings but also means to include their substantially equivalent ranges, for example, within errors of about few %.

Embodiment

[1. Circuit Configurations of Radio Frequency Circuit 1 and Communication Device 4]

Circuit configurations of a radio frequency circuit 1 and a communication device 4 according to the present embodiment are described with reference to FIG. 1. FIG. 1 is a circuit configuration diagram of the radio frequency circuit 1 and the communication device 4 according to the embodiment.

[1.1 Circuit Configuration of Communication Device 4]

First, the circuit configuration of the communication device 4 is described. As illustrated in FIG. 1, the communication device 4 according to the present embodiment includes the radio frequency circuit 1, an antenna 2, and a RF signal processing circuit (RFIC) 3.

The radio frequency circuit 1 transmits radio frequency signals between the antenna 2 and the RFIC 3. Details of the circuit configuration of the radio frequency circuit 1 will be described later.

The antenna 2 is connected to an antenna connection terminal 100 of the radio frequency circuit 1, sends a radio frequency signal output from the radio frequency circuit 1, or receives a radio frequency signal from outside and outputs a received radio frequency signal to the radio frequency circuit 1.

The RFIC 3 is an example of a signal processing circuit that performs processing on radio frequency signals. Specifically, the RFIC 3 performs signal processing such as down-converting and the like on a receiving signal input via a receiving path of the radio frequency circuit 1, and outputs a receiving signal generated by this signal processing to a baseband signal processing circuit (BBIC, not illustrated).

Further, the RFIC 3 performs signal processing such as up-converting and the like on a transmitting signal input from the BBIC, and outputs a transmitting signal generated by this signal processing to a transmitting path of the radio frequency circuit 1. Further, the RFIC 3 includes a control part that controls switches, amplifying elements, and the like included in the radio frequency circuit 1. Note that part or all of functions of the control part of the RFIC 3 may be installed outside the RFIC 3. For example, part or all of functions of the control part of the RFIC 3 may be installed in the BBIC or the radio frequency circuit 1.

Further, the RFIC 3 also functions as a control part that controls a power supply voltage Vcc and a bias voltage to be supplied to each of amplifiers included in the radio frequency circuit 1. Specifically, the RFIC 3 outputs digital control signals to the radio frequency circuit 1. Each amplifier of the radio frequency circuit 1 receives supply of the power supply voltage Vcc and the bias voltage that are controlled by the foregoing digital control signal.

Further, based on the communication band (frequency band) to be used, the RFIC 3 also functions as a control part that controls the connection of each switch included in the radio frequency circuit 1.

Note that in the communication device 4 according to the present embodiment, the antenna 2 is not an essential constituent element.

[1.2 Circuit Configuration of Radio Frequency Circuit 1]

Next, the circuit configuration of the radio frequency circuit 1 is described. As illustrated in FIG. 1, the radio frequency circuit 1 includes power amplifiers 11 and 12, a pre-amplifier 10, transformers 13 and 14, filters 61, 62, and 63, switches 21, 22, 31, 32, and 60, capacitors 41 and 42, matching circuits 51, 52, and 53, an input terminal 110, and the antenna connection terminal 100.

The input terminal 110 is connected to the RFIC 3, and the antenna connection terminal 100 is connected to the antenna 2.

The pre-amplifier 10 amplifies radio frequency signals of band A to band C input from the input terminal 110.

The transformer 13 has a primary side coil 131 and a secondary side coil 132. One end portion of the primary side coil 131 is connected to a power supply (power supply voltage Vcc), and the other end portion of the primary side coil 131 is connected to an output terminal of the pre-amplifier 10. One end portion of the secondary side coil 132 is connected to an input terminal of the power amplifier 11, and the other end portion of the secondary side coil 132 is connected to an input terminal of the power amplifier 12. The transformer 13 divides a radio frequency signal output from the pre-amplifier 10 into two radio frequency signals whose phases differ by a predetermined amount. These two divided radio frequency signals are input to the power amplifiers 11 and 12, respectively.

The power amplifier 11 is an example of a first amplifying element and has an amplifying transistor. The power amplifier 12 is an example of a second amplifying element and has an amplifying transistor. The amplifying transistor included in each of the power amplifiers 11 and 12 is, for example, a bipolar transistor such as a Heterojunction Bipolar Transistor (HBT) or the like, or a field effect transistor such as a MOSFET (Metal-Oxide-Semiconductor Field Effect Transistor) or the like.

The pre-amplifier 10, the power amplifiers 11 and 12, and the transformers 13 and 14 make up a differential amplification type amplifying circuit. Note that the pre-amplifier 10 and the transformer 13 are not necessarily included. Further, the pre-amplifier 10, the power amplifiers 11 and 12, and the transformers 13 and 14 may alternatively make up a Doherty type amplifying circuit by causing the power amplifier 11 to operate as a carrier amplifier and causing the power amplifier 12 to operate as a peak amplifier. In this case, a phase shifting circuit may be installed in place of the transformer 13, or a phase shifting line may be installed in between an output terminal of the power amplifier 11 and the one end portion of an input side coil 141 or in between an output terminal of the power amplifier 12 and the other end portion of the input side coil 141 or in both.

The transformer 14 has the input side coil 141 and an output side coil 142. One end portion of the input side coil 141 is connected to the output terminal of the power amplifier 11, and the other end portion of the input side coil 141 is connected to the output terminal of the power amplifier 12. A midpoint of the input side coil 141 is connected to the power supply (power supply voltage Vcc). One end portion of the output side coil 142 is connected to the filter 61 via the capacitor 41, a terminal 71, the switch 31, a terminal 73, and the matching circuit 51, and further connected to the filter 62 via the capacitor 41, the terminal 71, the switch 32, a terminal 74, and the matching circuit 52. The other end portion of the output side coil 142 is connected to the filter 63 via the capacitor 42, a terminal 72, a terminal 75, and the matching circuit 53. The transformer 14 combines radio frequency signals output from the power amplifiers 11 and 12. The combined radio frequency signal is output to one of the terminals 71 and 72.

The filter 61 is an example of a first filter and has a pass band that includes an uplink operation band of the band A (first band). An input port of the filter 61 is connected to the switch 31 via the matching circuit 51 and the terminal 73.

The filter 62 is an example of a second filter and has a pass band that includes an uplink operation band of the band B (second band). An input port of the filter 62 is connected to the switch 32 via the matching circuit 52 and the terminal 74.

The filter 63 is an example of a third filter and has a pass band that includes an uplink operation band of the band C (third band). An input port of the filter 63 is connected to the terminal 72 via the matching circuit 53 and the terminal 75.

The switch 60 is an example of an antenna switch and is connected to the antenna connection terminal 100. Moreover, the switch 60 switches between connecting and disconnecting the antenna connection terminal 100 to and from the filter 61, switches between connecting and disconnecting the antenna connection terminal 100 to and from the filter 62, and switches between connecting and disconnecting the antenna connection terminal 100 to and from the filter 63.

Note that the filters 61 to 63 may make up a multiplexer in which respective output ports of the filters 61 to 63 are connected to the antenna connection terminal 100, and in this case, the switch 60 may be omitted. Further, in the case where each of the filters 61 to 63 is for Frequency Division Duplex (FDD), each of the filters 61 to 63 may form a duplexer with a receiving filter, or in the case where each of the filters 61 to 63 is for Time Division Duplex (TDD), each of the filters 61 to 63 may be preceded or followed or preceded and followed by a switch that switches between transmitting and receiving.

The switch 21 is an example of a first switch and is connected between ground and a path P1 (first path) that connects the one end portion of the output side coil 142 and the filter 61. The switch 22 is an example of a second switch and is connected between the ground and a path P3 (second path) that connects the other end portion of the output side coil 142 and the filter 63.

The switch 31 is an example of a third switch and is arranged in series in a path between the switch 21 and the filter 61, which is part of the path P1. The switch 32 is an example of a fourth switch and is arranged in series in a path P2 (third path) that connects the filter 62 and a path connecting the switch 21 and the switch 31, which is part of the path P1.

Note that "the switch is arranged in series in a path that connects a and b" is defined to mean a state of layout of a switch switching between being electrically continuous between two terminals and being electrically discontinuous between these two terminals, in which one of the two terminals is connected to a, the other of the two terminals is connected to b, and connecting and disconnecting of a and b is switched by switching the switch between being electrically continuous and being electrically discontinuous.

Further, no switch is arranged in series in the path P3 (second path).

Note that each of the switches 21, 22, 31, and 32 is, for example, a switching element including an FET or the like. The switches 21, 22, 31, and 32 may be included in a semiconductor IC 70. Note that the semiconductor IC 70 has the terminals 71, 72, 73, 74, and 75, and is configured using, for example, a CMOS. Specifically, the semiconductor IC 70 is fabricated by a SOI (Silicon on Insulator) process. Note that the semiconductor IC 70 may be formed of at least one of GaAs, SiGe, and GaN. However, the semiconductor material forming the semiconductor IC 70 is not limited to the materials described above.

The capacitor 41 is connected to the one end portion of the output side coil 142 at one end (one of electrodes thereof) and to the terminal 71 at the other end (the other electrode). The capacitor 42 is connected to the other end portion of the output side coil 142 at one end (one of electrodes thereof) and to the terminal 72 at the other end (the other electrode).

The matching circuit 51 is connected between the terminal 73 and the input port of the filter 61 and provides matching between an input side impedance up to the terminal 73 and the impedance of the filter 61. The matching circuit 52 is connected between the terminal 74 and the input port of the filter 62 and provides matching between an input side impedance up to the terminal 74 and the impedance of the filter 62. The matching circuit 53 is connected between the terminal 75 and the input port of the filter 63 and provides matching between an input side impedance up to the terminal 75 and the impedance of the filter 63.

Each of the matching circuits 51 to 53 includes one of an inductor and a capacitor.

Note that the radio frequency circuit 1 according to the present embodiment may include the power amplifiers 11 and 12, the transformer 14, the filters 61, 62, and 63, and the switches 21, 22, 31, and 32.

Figure 2:
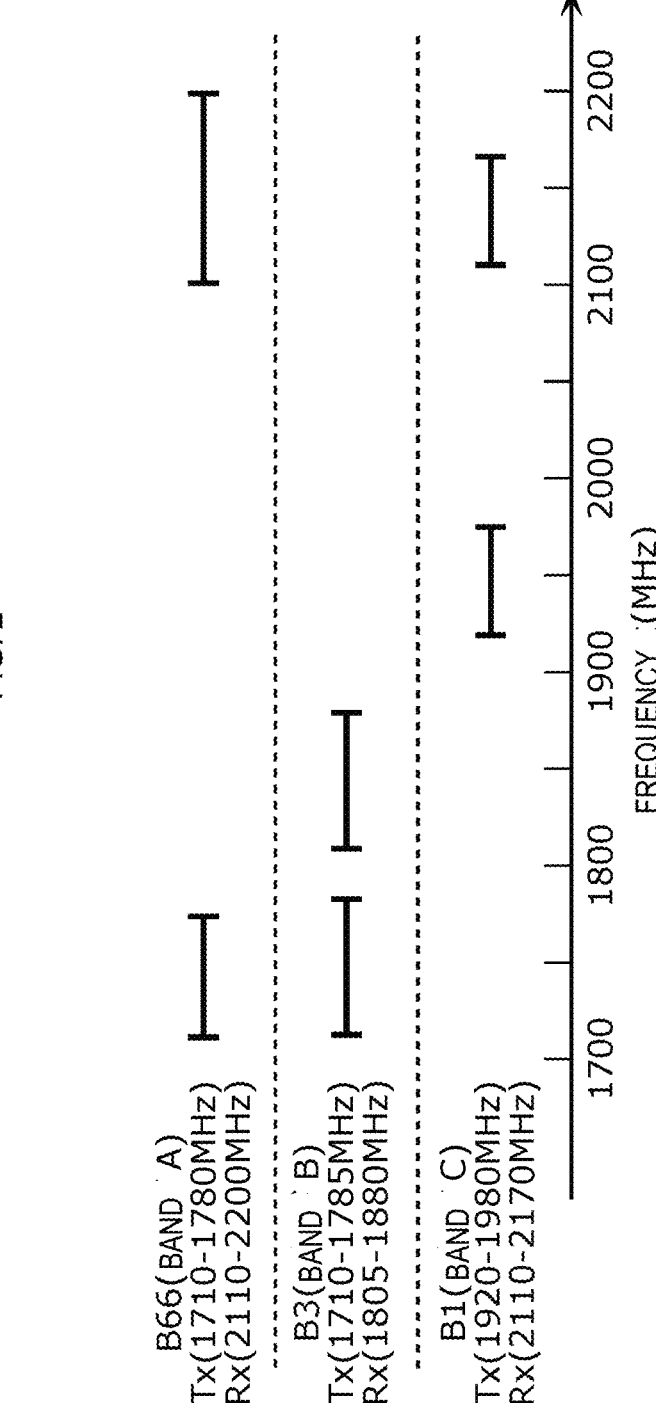
FIG. 2 is a diagram illustrating an example of band combination to be used in the radio frequency circuit according to the embodiment.

FIG. 2 is a diagram illustrating an example of band combination to be used in the radio frequency circuit 1 according to the embodiment. In the radio frequency circuit 1 according to the present embodiment, the band A is, for example, Band 66 for 4G (4th Generation)-LTE (Long Term Evolution) or Band n66 (uplink operation band Tx: 1710-1780 MHz, downlink operation band Rx: 2110-2200 MHz) for 5G (5th Generation)-NR (New Radio). Further, the band B is, for example, Band 3 for 4G-LTE or Band n3 for 5G-NR (uplink operation band Tx: 1710-1785 MHz, downlink operation band Rx: 1805-1880 MHz). Further, the band C is, for example, Band 1 for 4G-LTE or Band n1 for 5G-NR (uplink operation band Tx: 1920-1980 MHz, downlink operation band Rx: 2110-2170 MHz).

As illustrated in FIG. 2, the uplink operation band of the band A and the uplink operation band of the band B overlap each other in frequency. Note that the foregoing two uplink operation bands described above are not necessarily overlap each other in frequency.

Note that in the present embodiment, each of the band A to the band C is defined to mean a frequency band predefined by a standards group for constructing a communication system using a radio access technology (RAT) (for example, 3GPP (Registered Trademark) (3rd Generation Partnership Project), IEEE (Institute of Electrical and Electronics Engineers), and the like) or any other similar group, and is not limited to the bands exemplified above. In the present embodiment, as the communication system, for example, a 4G-LTE system, a 5G-NR system, a WLAN (Wireless Local Area Network) system, and the like can be used. However, the communication system is not limited thereto.

According to the foregoing circuit configuration, the radio frequency circuit 1 can send a radio frequency signal of any one of the band A to the band C from the input terminal 110 toward the antenna connection terminal 100. In this case, no switch is arranged in series in the path P3 that transmits the band C. Thus, it becomes possible to transmit a radio frequency signal of the band C with low loss.

[1.3 Flow of Radio Frequency Signal in Radio Frequency Circuit 1]

Next, flows of radio frequency signals of the band A to the band C in the radio frequency circuit 1 are described.

Figure 3A:
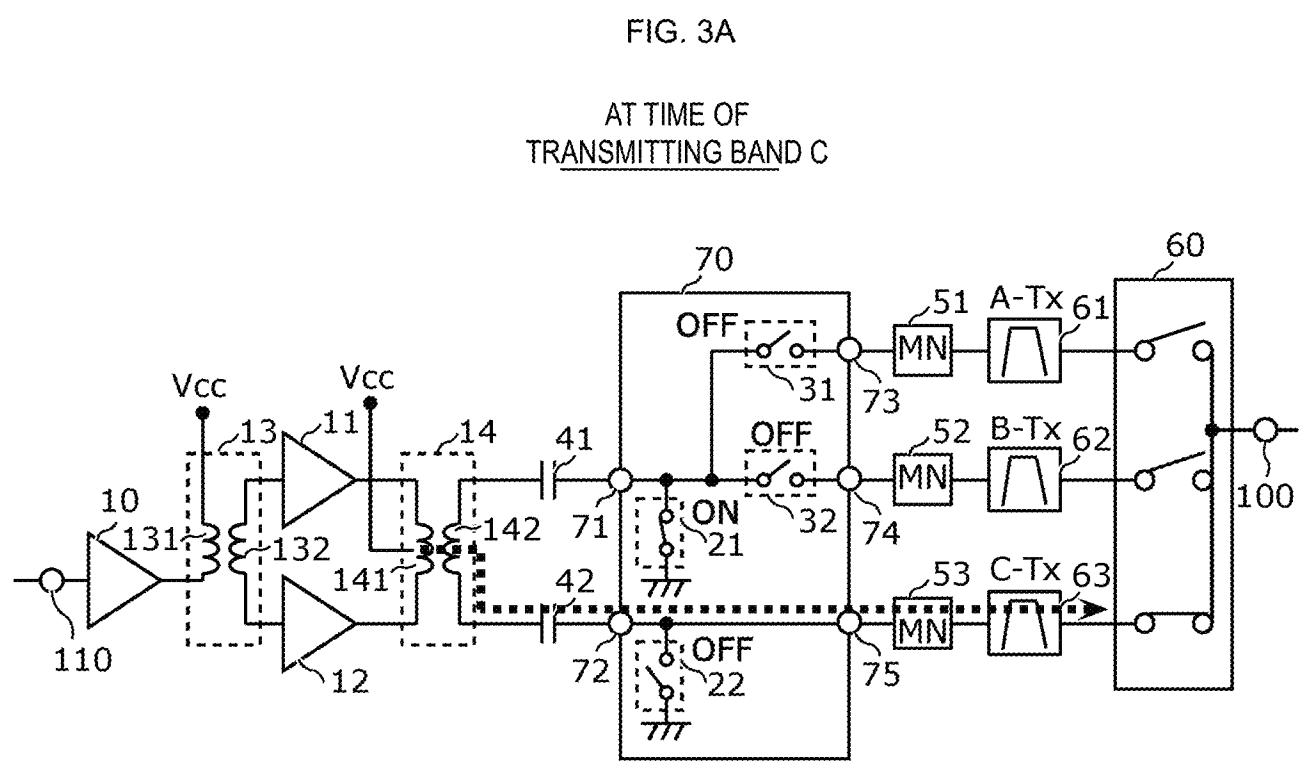

FIG. 3A is a circuit state diagram of the radio frequency circuit 1 according to the embodiment assuming a signal of the band C is transmitted. As illustrated in FIG. 3A, assuming a signal of the band C is transmitted, the switches 22, 31, and 32 are in an electrically discontinuous state (OFF), and the switch 21 is in an electrically continuous state (ON). To transmit a signal of the band C output from the power amplifiers 11 and 12 to the path P3 via the terminal 72, it is necessary to short-circuit the one end portion of the output side coil 142. Because of this, by setting the switch 21 to the electrically continuous state (ON), it becomes possible to short-circuit the one end portion of the output side coil 142. On the other hand, by setting the switch 22 to the electrically discontinuous state (OFF), it becomes possible to transmit a signal of the band C from the terminal 72 toward the filter 63. In this case, no switch is arranged in series in the path P3 that transmits a transmitting signal of the band C. Thus, it becomes possible to transmit a radio frequency signal of the band C with low loss.

Note that because there is a connecting wiring line between the one end portion of the output side coil 142 and the switch 21, even assuming a nearby part of the switch 21 is short-circuited to the ground by setting the switch 21 to the electrically continuous state (ON), in some cases, the impedance of the one end portion of the output side coil 142 deviates from a short-circuit point by the amount corresponding to the inductance component of this connecting wiring line. In response, the capacitor 41 may be installed between the switch 21 and the one end portion of the output side coil 142. The capacitor 41 enables the impedance at the one end portion of the output side coil 142, which was deviated from the short-circuit point due to the inductance component of the foregoing connecting wiring line, to be that of a short-circuit condition precisely.

Note that, of the capacitor 41 and the switch 21, it is desirable that the capacitor 41 is connected closer to the one end portion of the output side coil 142.

Further, in this case, the switches 31 and 32 are in the electrically discontinuous state (OFF). Because of this, it becomes possible to precisely suppress leaking of signal of the band C from the terminal 71 toward the filters 61 and 62.

Figure 3B:
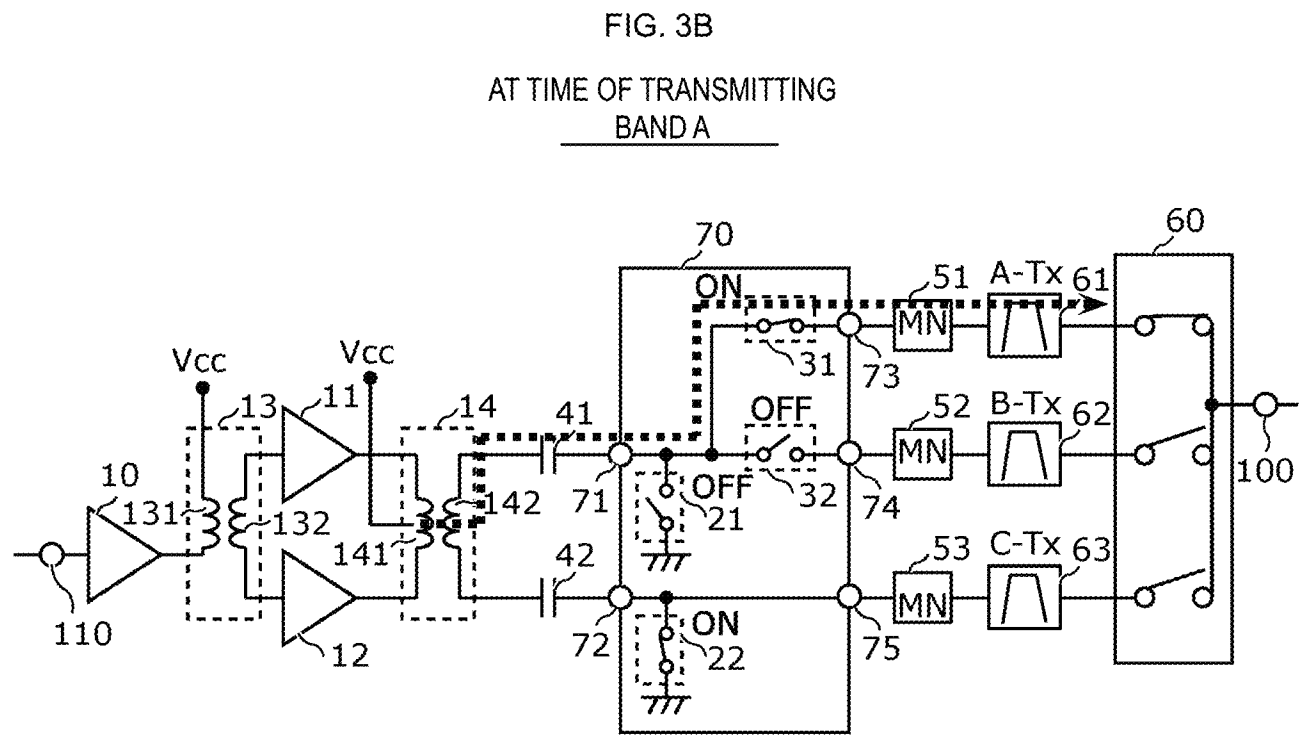

FIG. 3B is a circuit state diagram of the radio frequency circuit 1 according to the embodiment assuming a signal of the band A is transmitted. As illustrated in FIG. 3B, assuming a signal of the band A is transmitted, the switches 21 and 32 are in the electrically discontinuous state (OFF), and the switches 22 and 31 are in the electrically continuous state (ON). To transmit a signal of the band A output from the power amplifiers 11 and 12 to the path P1 via the terminal 71, it is necessary to short-circuit the other end portion of the output side coil 142. Because of this, by setting the switch 22 to the electrically continuous state (ON), it becomes possible to short-circuit the other end portion of the output side coil 142. On the other hand, by setting the switch 21 to the electrically discontinuous state (OFF) and setting the switch 31 to the electrically continuous state (ON), it becomes possible to transmit a signal of the band A from the terminal 71 toward the filter 61. Further, in this case, the switch 32 is in the electrically discontinuous state (OFF). Because of this, it becomes possible to precisely suppress leaking of signal of the band A from the terminal 71 toward the filter 62.

Note that because there is a connecting wiring line between the other end portion of the output side coil 142 and the switch 22, even assuming a nearby part of the switch 22 is short-circuited to the ground by setting the switch 22 to the electrically continuous state (ON), in some cases, the impedance of the other end portion of the output side coil 142 deviates from the short-circuit point by the amount corresponding to the inductance component of this connecting wiring line. In response, the capacitor 42 may be installed between the switch 22 and the other end portion of the output side coil 142. The capacitor 42 enables the impedance at the other end portion of the output side coil 142, which was deviated from the short-circuit point due to the inductance component of the foregoing connecting wiring line, to be that of the short-circuit condition precisely.

Note that, of the capacitor 42 and the switch 22, it is desirable that the capacitor 42 is connected closer to the other end portion of the output side coil 142.

Further, although it is not illustrated, assuming a signal of the band B is transmitted, the switches 21 and 31 are in the electrically discontinuous state (OFF), and the switches 22 and 32 are in the electrically continuous state (ON). To transmit a signal of the band B output from the power amplifiers 11 and 12 to the path P2 via the terminal 71, it is necessary to short-circuit the other end portion of the output side coil 142. Because of this, by setting the switch 22 to the electrically continuous state (ON), it becomes possible to short-circuit the other end portion of the output side coil 142. On the other hand, by setting the switch 21 to the electrically discontinuous state (OFF) and setting the switch 32 to the electrically continuous state (ON), it becomes possible to transmit a signal of the band B from the terminal 71 toward the filter 62. Further, in this case, the switch 31 is in the electrically discontinuous state (OFF). Because of this, it becomes possible to precisely suppress leaking of signal of the band B from the terminal 71 toward the filter 61.

Note that the uplink operation band of the band A and the uplink operation band of the band B may overlap each other in frequency. Even in this case, the switch 31 and the switch 32 are arranged in series in the path P1 that transmits a transmitting signal of the band A and in the path P2 that transmits a transmitting signal of the band B, respectively, and thus, a mutually exclusive operation of the switches 31 and 32 can secure isolation between the path P1 and the path P2.

Further, the uplink operation band of the band C may be higher in frequency than the uplink operation bands of the band A and the band B. In other words, the pass band of the filter 63 may be higher in frequency than the pass bands of the filters 61 and 62. As the frequency increases, the transmission loss of radio frequency signal increases. From this viewpoint, there is a possibility that a transmitting signal of the band C, which is the highest in frequency of the bands A, B, and C, has the largest transmission loss. However, in the radio frequency circuit 1 according to the present embodiment, no switch is arranged in series in the path P3 that transmits a transmitting signal of the band C, and thus, it becomes possible to reduce the transmission loss of transmitting signal of the band C. Accordingly, the signal transmission loss of the radio frequency circuit 1 can be reduced effectively.

[1.4 Circuit Configuration of Radio Frequency Circuit 1A According to Modified Example 1]

Figure 4:
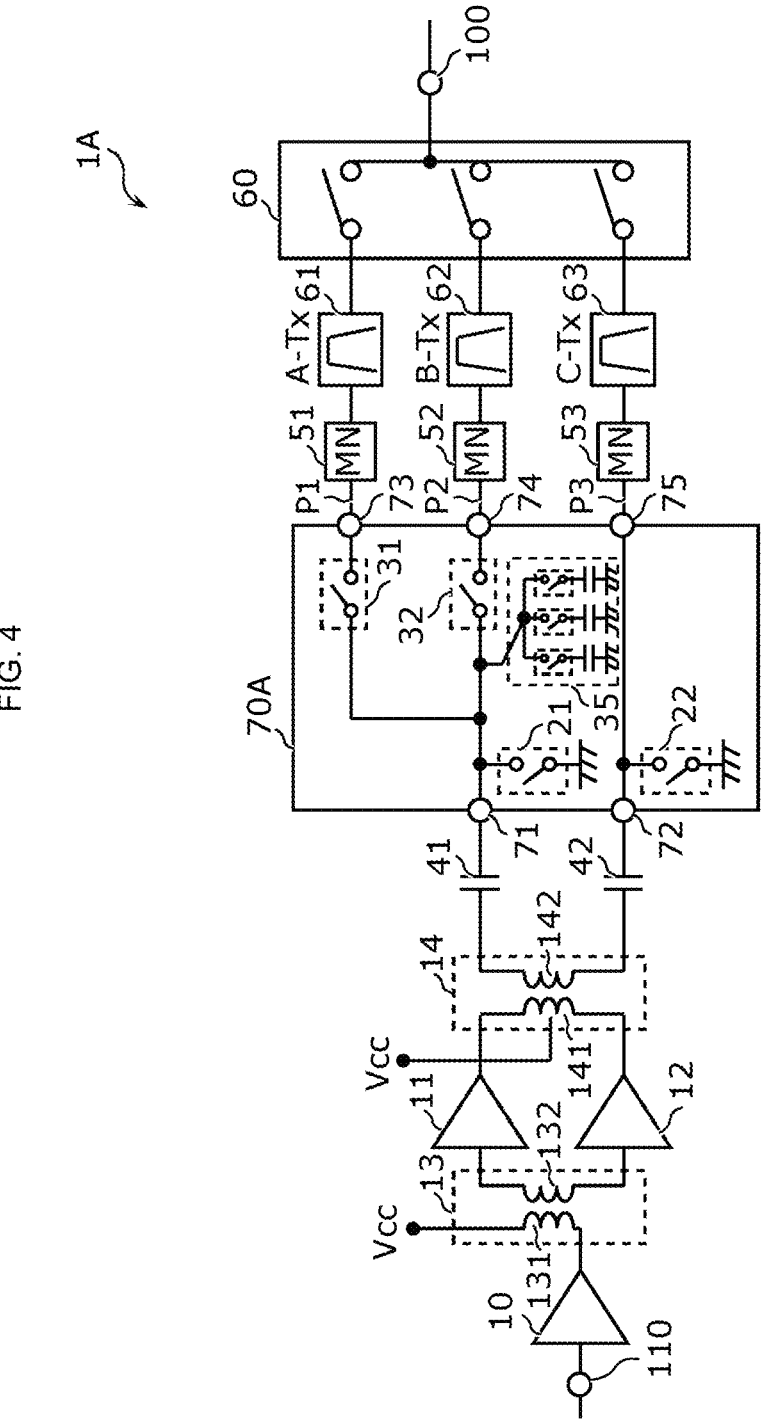
FIG. 4 is a circuit configuration diagram of a radio frequency circuit according to a modified example 1 of the embodiment.

FIG. 4 is a circuit configuration diagram of a radio frequency circuit 1A according to a modified example 1 of the embodiment. As illustrated in FIG. 4, the radio frequency circuit 1A includes the power amplifiers 11 and 12, the pre-amplifier 10, transformers 13 and 14, the filters 61, 62, and 63, the switches 21, 22, 31, 32, and 60, the capacitors 41 and 42, a DTC (Digital Tunable Capacitor) 35, the matching circuits 51, 52, and 53, the input terminal 110, and the antenna connection terminal 100. The radio frequency circuit 1A according to the present modified example is different from the radio frequency circuit 1 according to the embodiment in that the DTC 35 is added. Hereinafter, the radio frequency circuit 1A according to the present modified example is described with the emphasis on constituent elements different from the radio frequency circuit 1 according to the embodiment, and the descriptions regarding the same constituent elements as those of the radio frequency circuit 1 according to the embodiment are omitted.

The DTC 35 has a configuration in which a plurality of capacitors is connected to a common terminal. Connecting and disconnecting each of the plurality of capacitors to and from the common terminal are switched by a switch. Because of this, the DTC 35 can change its capacitance value in a stepwise manner in response to the switching of connection of the foregoing switch. Note that the switching of the capacitance value of the DTC 35 is performed by the control part of the RFIC 3 described above.

The common terminal of the DTC 35 is connected to a path that connects the one end portion of the output side coil 142 and a connecting point of the switches 31 and 32. More specifically, the common terminal of the DTC 35 is connected to the path where part of the path P1 between the switch 21 and the switch 31 and part of the path P2 between the switch 21 and the switch 32 overlap. This enables the capacitance value of the DTC 35, which has a small size, to change according to the transmission of a transmitting signal of the band A and the transmission of a transmitting signal of the band B. Thus, it becomes possible to precisely adjust the impedances on the input sides of the filters 61 and 62 and downsize the radio frequency circuit 1A.

Note that the DTC 35 may be included in the semiconductor IC 70A including the switches 21, 22, 31, and 32. According to this, the radio frequency circuit 1A can be further downsized.

[1.5 Circuit Configuration of Radio Frequency Circuit 1B According to Modified Example 2]

Figure 5:
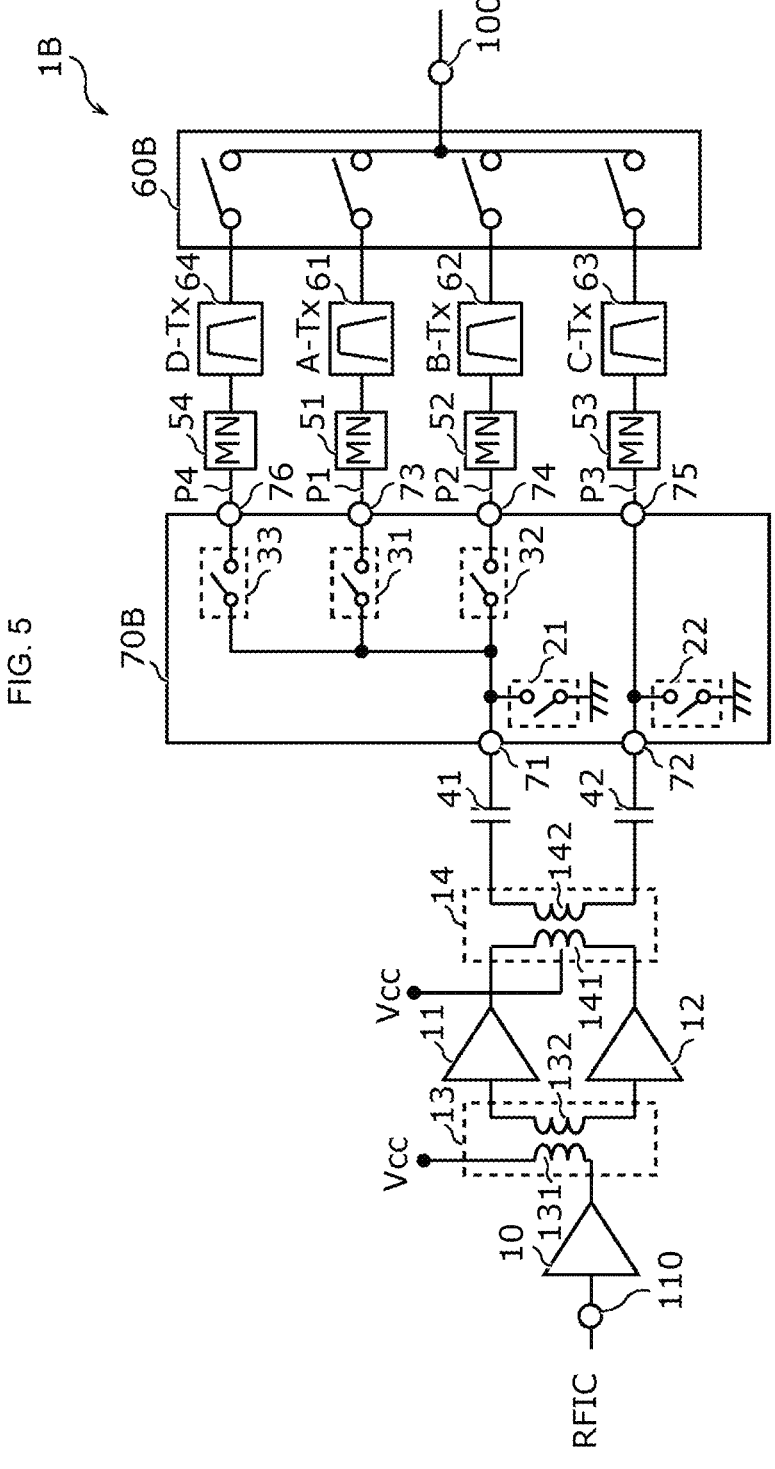
FIG. 5 is a circuit configuration diagram of a radio frequency circuit according to a modified example 2 of the embodiment.

FIG. 5 is a circuit configuration diagram of a radio frequency circuit 1B according to a modified example 2 of the embodiment. As illustrated in FIG. 5, the radio frequency circuit 1B includes the power amplifiers 11 and 12, the pre-amplifier 10, the transformers 13 and 14, filters 61, 62, 63, and 64, switches 21, 22, 31, 32, 33, and 60B, the capacitors 41 and 42, matching circuits 51, 52, 53, and 54, the input terminal 110, and the antenna connection terminal 100. The radio frequency circuit 1B according to the present modified example is different from the radio frequency circuit 1 according to the embodiment in that a path that transmits a transmitting signal of band D is added. Hereinafter, the radio frequency circuit 1B according to the present modified example is described with the emphasis on constituent elements different from the radio frequency circuit 1 according to the embodiment, and the descriptions regarding the same constituent elements as those of the radio frequency circuit 1 according to the embodiment are omitted.

The pre-amplifier 10 amplifies radio frequency signals of the band A to the band D input from the input terminal 110.

The one end portion of the output side coil 142 is connected to the filter 61 via the capacitor 41, the terminal 71, the switch 31, the terminal 73, and the matching circuit 51. Further, the one end portion of the output side coil 142 is connected to the filter 62 via the capacitor 41, the terminal 71, the switch 32, the terminal 74, and the matching circuit 52. Further, the one end portion of the output side coil 142 is connected to the filter 64 via the capacitor 41, the terminal 71, the switch 33, a terminal 76, and the matching circuit 54. The other end portion of the output side coil 142 is connected to the filter 63 via the capacitor 42, the terminal 72, the terminal 75, and the matching circuit 53.

The filter 64 has a pass band that includes an uplink operation band of the band D. An input port of the filter 64 is connected to the switch 33 via the matching circuit 54 and the terminal 76.

The switch 60B is an example of an antenna switch and is connected to the antenna connection terminal 100. Moreover, the switch 60B switches between connecting and disconnecting the antenna connection terminal 100 to and from the filter 61, switches between connecting and disconnecting the antenna connection terminal 100 to and from the filter 62, switches between connecting and disconnecting the antenna connection terminal 100 to and from the filter 63, and switches between connecting and disconnecting the antenna connection terminal 100 to and from the filter 64.

The switch 33 is arranged in series in a path P4 that connects the filter 64 and a path connecting the switch 21 and the switch 31.

Further, no switch is arranged in series in the path P3 (second path).

The matching circuit 54 is connected between the terminal 76 and the input port of the filter 64 and provides matching between an input side impedance up to the terminal 76 and the impedance of the filter 64.

Each of the matching circuits 51 to 54 includes one of an inductor and a capacitor.

According to the foregoing circuit configuration, the radio frequency circuit 1B can send a radio frequency signal of any one of the band A to the band D from the input terminal 110 toward the antenna connection terminal 100. In this case, no switch is arranged in series in the path P3 that transmits the band C. Thus, it becomes possible to transmit a radio frequency signal of the band C with low loss.

Specifically, assuming a signal of the band C is transmitted, the switches 22, 31, 32, and 33 are in the electrically discontinuous state (OFF), and the switch 21 is in the electrically continuous state (ON). To transmit a signal of the band C output from the power amplifiers 11 and 12 to the path P3 via the terminal 72, it is necessary to short-circuit the one end portion of the output side coil 142. Because of this, by setting the switch 21 to the electrically continuous state (ON), it becomes possible to short-circuit the one end portion of the output side coil 142. On the other hand, by setting the switch 22 to the electrically discontinuous state (OFF), it becomes possible to transmit a signal of the band C from the terminal 72 toward the filter 63. In this case, no switch is arranged in series in the path P3 that transmits a transmitting signal of the band C. Thus, it becomes possible to transmit a radio frequency signal of the band C with low loss.

Further, assuming a signal of the band D is transmitted, the switches 21, 31, and 32 are in the electrically discontinuous state (OFF), and the switches 22 and 33 are in the electrically continuous state (ON). To transmit a signal of the band D output from the power amplifiers 11 and 12 to the path P4 via the terminal 71, it is necessary to short-circuit the other end portion of the output side coil 142. Because of this, by setting the switch 22 to the electrically continuous state (ON), it becomes possible to short-circuit the other end portion of the output side coil 142. On the other hand, by setting the switch 21 to the electrically discontinuous state (OFF) and setting the switch 33 to electrically continuous state (ON), it becomes possible to transmit a signal of the band D from the terminal 71 toward the filter 64. Further, in this case, the switches 31 and 32 are in the electrically discontinuous state (OFF). Because of this, it becomes possible to precisely suppress leaking of signal of the band D from the terminal 71 toward the filters 61 and 62.

Note that in the radio frequency circuit 1B according to the present modified example, the number of bands of transmitting signals to transmit may be five or more. In this case, five or more filters corresponding to the respective bands are installed. Further, one filter that transmits a transmitting signal of the band, which is one of the five or more bands, whose transmission loss is most desired to be reduced may be connected to the other end portion of the output side coil 142, and the other filters may be connected to the one end portion of the output side coil 142.

[1.6 Mounting Configuration of Radio Frequency Circuit 1]

A mounting configuration of the radio frequency circuit 1 according to the present embodiment is described with reference to FIG. 6.

Figure 6:
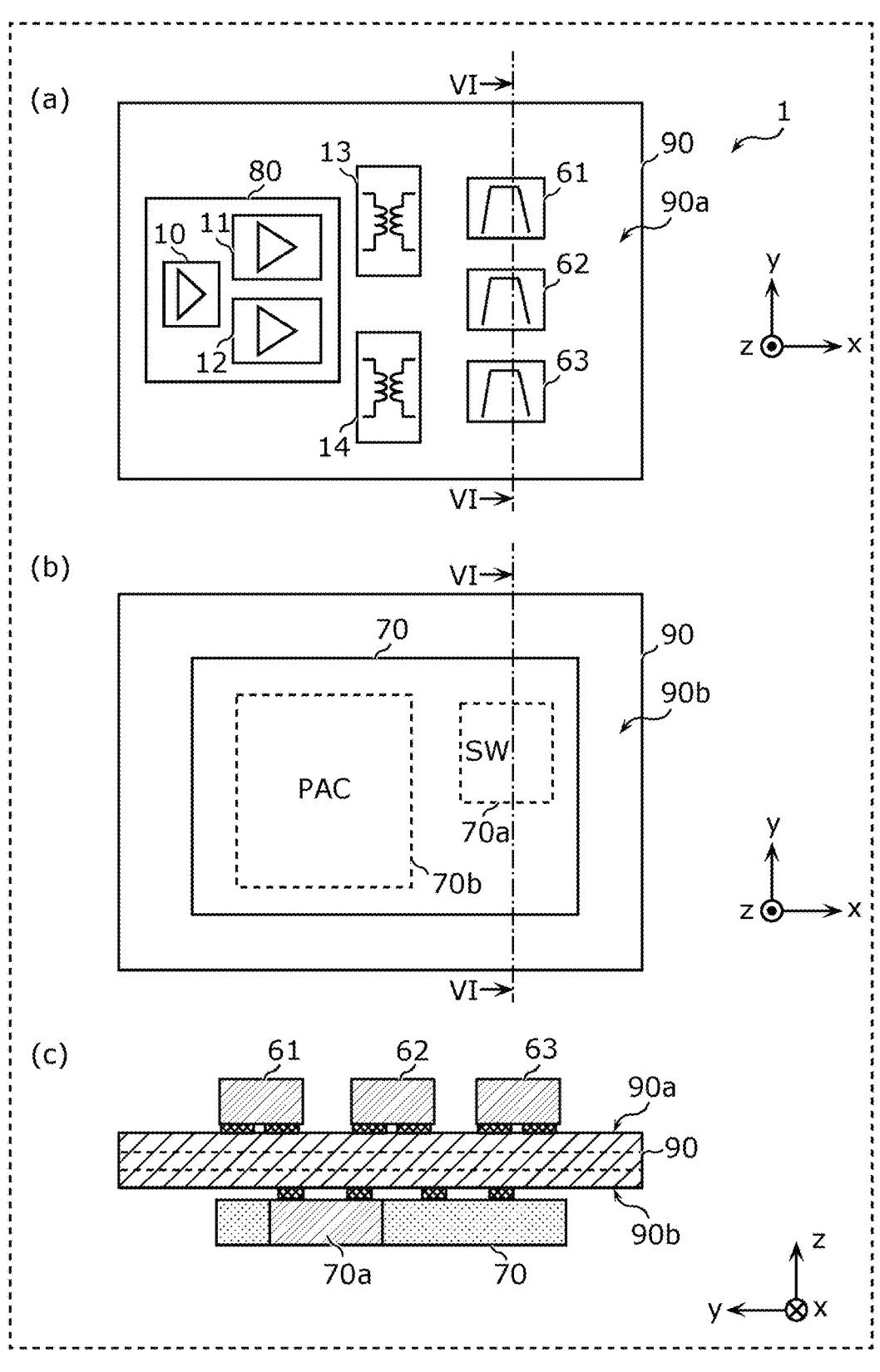
FIG. 6 shows plan views and a cross-sectional view of a radio frequency circuit according to a working example.

FIG. 6 shows plan views and a cross-sectional view of a radio frequency circuit 1 according to a working example. FIG. 6(*a*) is a view of a module board 90 seeing from the positive side of the z-axis toward a principal surface 90*a* side, and FIG. 6(*b*) is a transparent view of the module board 90 seeing from the positive side of the z-axis toward a principal surface 90*b* side. FIG. 6(*c*) is a cross-sectional view of the radio frequency circuit 1 according to the working example. The cross section of the radio frequency circuit 1 in FIG. 6(*c*) is a cross section cut along the line VI-VI in FIG. 6(*a*) and FIG. 6(*b*).

Note that in FIG. 6(*a*), to facilitate the understanding of spatial relationships between components, in some cases, symbols representing their identifications are attached to the components. However, such symbols are not attached to actual components. Further, in FIG. 6, the illustration of wiring lines connecting a plurality of electronic components arranged on the module board 90 is omitted. Further, in FIG. 6, the illustration of a resin member covering a plurality of electronic components and a shield electrode layer covering the resin member is omitted.

In addition to a plurality of electronic components that includes a plurality of circuit elements included in the radio frequency circuit 1 illustrated in FIG. 1, the radio frequency circuit 1 includes the module board 90.

The module board 90 has the principal surfaces 90*a* and 90*b* that face each other. The principal surfaces 90*a* and 90*b* are examples of a first principal surface and a second principal surface, respectively. Note that in FIG. 6, the module board 90 has a rectangular shape in planar view. However, the shape of the module board 90 is not limited thereto.

As the module board 90, for example, a low temperature co-fired ceramics (LTCC) board, a high temperature co-fired ceramics (HTCC) board, a board with built-in components, a board having a redistribution layer (RDL), a printed board, or the like, each of which has a multilayer structure including a plurality of dielectric layers, can be used. However, the module board 90 is not limited thereto.

On the principal surface 90*a*, the power amplifiers 11 and 12, the pre-amplifier 10, the transformers 13 and 14, and the filters 61, 62, and 63 are arranged. A semiconductor IC 80 is configured to include the pre-amplifier 10 and the power amplifiers 11 and 12.

The semiconductor IC 80 is, for example, configured using a CMOS and specifically fabricated by a SOI process. Note that the semiconductor IC 80 may be formed of at least one of GaAs, SiGe, and GaN. However, the semiconductor material forming the semiconductor IC 80 is not limited to the materials described above.

On the principal surface 90*b*, a semiconductor IC 70 is arranged. The semiconductor IC 70 is made up of a switch part 70*a* and a PA control part 70*b*.

The switch part 70*a* includes the switches 21, 22, 31, and 32. The PA control part 70*b* is an example of a control circuit part and is a circuit that controls the power amplifiers 11 and 12.

Note that the semiconductor IC 70 only needs to have at least the switch part 70*a*, and the PA control part 70*b* may alternatively be included in another semiconductor IC different from the semiconductor IC 70.

Note that the switch 60, the matching circuits 51 to 53, and the capacitors 41 and 42 are not illustrated in FIG. 6. However, the switch 60, the matching circuits 51 to 53, and the capacitors 41 and 42 may be arranged on the principal surface 90*a* or 90*b* or in the inside of the module board 90. Further, the transformers 13 and 14 may alternatively be arranged on the principal surface 90*b* or in the inside of the module board 90.

According to the foregoing configuration, the circuit components that make up the radio frequency circuit 1 are spread onto the principal surfaces 90*a* and 90*b*, and thus, it becomes possible to downsize the radio frequency circuit 1.

Here, assuming the module board 90 is seen in planar view, at least one of the filters 61 and 62 at least partially overlaps the switch part 70*a*.

According to this, at least one of the wiring line (path P1) connecting the filter 61 and the switch 31 and the wiring line (path P2) connecting the filter 62 and the switch 32 can be made shorter. No switch is arranged in series in the path P3, and thus, the transmission loss of the wiring line (path P3) connecting the filter 63 and the switch 22 can be reduced. On the other hand, in the path P1 and the path P2, the switches are each arranged in series, and thus, the transmission loss tends to increase by the amount corresponding to the ON-resistances of these switches. However, because of the foregoing configuration, the paths P1 and P2 can be made shorter, and thus, the increased amount of the transmission loss caused by the foregoing ON-resistances can be suppressed. Accordingly, the size and the transmission loss of the radio frequency circuit 1 can be reduced.

[2. Advantageous Effects and the Like]

As described above, the radio frequency circuit 1 according to the present embodiment includes the power amplifiers 11 and 12, the transformer 14 having the input side coil 141 and the output side coil 142, the filter 61 having the pass band that includes the uplink operation band of the band A, the filter 62 having the pass band that includes the uplink operation band of the band B, the filter 63 having the pass band that includes the uplink operation band of the band C, the switch 21 connected between the ground and the path P1 connecting the one end portion of the output side coil 142 and the filter 61, the switch 22 connected between the ground and the path P3 connecting the other end portion of the output side coil 142 and the filter 63, the switch 31 arranged in series in the path P1 in between the switch 21 and the filter 61, and the switch 32 arranged in series in the path P2 connecting the filter 62 and a path that is part of the path P1 and connects the switch 21 and the switch 31, wherein no switch is arranged in series in the path P3.

According to the foregoing circuit configuration, the radio frequency circuit 1 can transmit transmitting signals of the band A to the band C. In this case, no switch is arranged in series in the path P3 that transmits the band C. Thus, it becomes possible to transmit a radio frequency signal of the band C with low loss. Accordingly, it becomes possible to provide a multiband radio frequency circuit 1 that has a plurality of amplifying elements and a transformer and can transmit radio frequency signals with low loss.

Further, for example, in the radio frequency circuit 1, assuming a signal of the band A is transmitted, the switches 22 and 31 may be in an electrically continuous state, and the switch 21 and the switch 32 may be in an electrically discontinuous state, and assuming a signal of the band B is transmitted, the switches 22 and 32 may be in the electrically continuous state, and the switches 21 and 31 may be in the electrically discontinuous state.

According to this, by setting the switch 22 to the electrically continuous state, it becomes possible to short-circuit the other end portion of the output side coil 142. By setting the switch 21 to the electrically discontinuous state and setting the switch 31 to the electrically continuous state, it becomes possible to transmit a signal of the band A toward the filter 61. Further, in this case, the switch 32 is in the electrically discontinuous state, and thus, it becomes possible to precisely suppress leaking of signal of the band A toward the filter 62. On the other hand, by setting the switch 21 to the electrically discontinuous state and setting the switch 32 to the electrically continuous state, it becomes possible to transmit a signal of the band B toward the filter 62. Further, in this case, the switch 31 is in the electrically discontinuous state, and thus, it becomes possible to precisely suppress leaking of signal of the band B toward the filter 61.

Further, for example, in the radio frequency circuit 1, assuming a signal of the band C is transmitted, the switch 21 may be in the electrically continuous state, and the switches 22, 31, and 32 may be in the electrically discontinuous state.

According to this, by setting the switch 21 to the electrically continuous state, it becomes possible to short-circuit the one end portion of the output side coil 142. On the other hand, by setting the switch 22 to the electrically discontinuous state, it becomes possible to transmit a signal of the band C toward the filter 63. In this case, no switch is arranged in series in the path P3 that transmits a transmitting signal of the band C. Thus, it becomes possible to transmit a radio frequency signal of the band C with low loss.

Further, for example, in the radio frequency circuit 1, the pass band of the filter 63 may be higher in frequency than the pass bands of the filters 61 and 62.

The transmission loss of radio frequency signal increases as the frequency increases. From this viewpoint, there is a possibility that a transmitting signal of the band C, which is the highest in frequency of the bands A, B, and C, has the largest transmission loss. However, according to the foregoing configuration, no switch is arranged in series in the path P3 that transmits a transmitting signal of the band C, and thus, it becomes possible to reduce the transmission loss of transmitting signal of the band C. Accordingly, the signal transmission loss of the radio frequency circuit 1 can be reduced effectively.

Further, for example, in the radio frequency circuit 1, The pass band of the filter 61 may partially overlap the pass band of the filter 62 in frequency.

Even in this case, the switch 31 and the switch 32 are arranged in series in the path P1 that transmits a transmitting signal of the band A and in the path P2 that transmits a transmitting signal of the band B, respectively, and thus, the mutually exclusive operation of the switches 31 and 32 can secure isolation between the path P1 and the path P2.

Further, for example, the radio frequency circuit 1A according to the modified example 1 may further include the DTC 35 connected between the one end portion of the output side coil 142 and the connecting point of the switches 31 and 32.

This enables the capacitance value of the DTC 35, which has a small size, to change according to the transmission of a transmitting signal of the band A and the transmission of a transmitting signal of the band B. Thus, it becomes possible to precisely adjust the impedances on the input sides of the filters 61 and 62 and downsize the radio frequency circuit 1A.

Further, for example, the radio frequency circuit 1 may further include the module board 90 having the principal surfaces 90a and 90b, the switches 21, 22, 31, and 32 may be included in the semiconductor IC 70, the power amplifiers 11 and 12, the transformer 14, and the filters 61, 62, and 63 may be arranged on the principal surface 90a, and the semiconductor IC 70 may be arranged on the principal surface 90b.

According to this, the circuit components that make up the radio frequency circuit 1 are spread onto the principal surfaces 90a and 90b, and thus, it becomes possible to downsize the radio frequency circuit 1.

Further, for example, in the radio frequency circuit 1, the semiconductor IC 70 may have the switch part 70a in which the switches 21, 22, 31, and 32 are arranged and the PA control part 70b that controls the power amplifiers 11 and 12, and assuming the module board 90 is seen in planar view, at least one of the filters 61 and 62 may at least partially overlap the switch part 70a.

According to this, at least one of the wiring line (path P1) connecting the filter 61 and the switch 31 and the wiring line (path P2) connecting the filter 62 and the switch 32 can be made shorter. Because of this, the increased amount of the transmission loss caused by the ON-resistances of the switches 31 and 32 arranged in series in the paths P1 and P2 can be reduced. Accordingly, the size and the transmission loss of the radio frequency circuit 1 can be reduced.

Further, for example, in the radio frequency circuit 1, the band A may be Band 66 for 4G-LTE or Band n66 for 5G-NR, the band B may be Band 3 for 4G-LTE or Band n3 for 5G-NR, and the band C may be Band 1 for 4G-LTE or Band n1 for 5G-NR.

Further, the communication device 4 according to the present embodiment includes the RFIC 3 that performs processing on a radio frequency signal and the radio frequency circuit 1 that transmits a radio frequency signal between the RFIC 3 and the antenna 2.

According to this, it becomes possible to realize the advantageous effects of the radio frequency circuit 1 in the communication device 4.

(Other Embodiments and the Like)

The radio frequency circuits and the communication devices according to the embodiments of the present disclosure have been described using the embodiment, the working example, and the modified examples. However, the radio frequency circuit and the communication device according to the present disclosure are not limited to the foregoing embodiments, working examples, and modified examples. Other embodiments realized by combining optional constituent elements of the foregoing embodiment, working examples, and modified examples, modified examples obtained by applying various modifications conceivable to those skilled in the art to the foregoing embodiments, working examples, and modified examples without departing the scope of the present disclosure, and various devices incorporating the foregoing radio frequency circuits and communication devices may also be included in the present disclosure.

Further, for example, in the radio frequency circuits and the communication devices according to the foregoing embodiments, working examples, and the modified examples, another circuit element, a wiring line, or the like may be inserted in the path connecting each circuit element and the signal path disclosed in the drawing.

INDUSTRIAL APPLICABILITY

The present disclosure can be widely used in communication devices such as mobile phones and the like as a radio frequency circuit to be installed in a multiband front-end unit.

REFERENCE SIGNS LIST

1, 1A, 1B Radio frequency circuit
2 Antenna
3 RF signal processing circuit (RFIC)
4 Communication device
10 Pre-amplifier
11, 12 Power amplifier
13, 14 Transformer
21, 22, 31, 32, 33, 60, 60B Switch
35 DTC
41, 42 Capacitor
51, 52, 53, 54 Matching circuit
61, 62, 63, 64 Filter
70, 70A, 70B, 80 Semiconductor IC
70a Switch part
70b PA control part
71, 72, 73, 74, 75, 76 Terminal
90 Module board
90a, 90b Principal surface
100 Antenna connection terminal
110 Input terminal
131 Primary side coil
132 Secondary side coil

141 Input side coil
142 Output side coil

The invention claimed is:

1. A radio frequency circuit comprising:
a first amplifying element and a second amplifying element;
a transformer having an input side coil and an output side coil;
a first filter having a pass band that includes a first band;
a second filter having a pass band that includes a second band;
a third filter having a pass band that includes a third band;
a first switch connected between a first path and ground, the first path connecting one end portion of the output side coil and the first filter;
a second switch connected between a second path and the ground, the second path connecting another end portion of the output side coil and the third filter;
a third switch arranged in series in the first path in between the first switch and the first filter; and
a fourth switch arranged in series in a third path connecting a path and the second filter, the path being part of the first path and connecting the first switch and the third switch, wherein
no switch is arranged in series in the second path.

2. The radio frequency circuit according to claim 1, wherein
assuming a signal of the first band is transmitted, the second switch and the third switch are in an electrically continuous state, and the first switch and the fourth switch are in an electrically discontinuous state, and
assuming a signal of the second band is transmitted, the second switch and the fourth switch are in the electrically continuous state, and the first switch and the third switch are in the electrically discontinuous state.

3. The radio frequency circuit according to claim 2, wherein
assuming a signal of the third band is transmitted, the first switch is in the electrically continuous state, and the second switch, the third switch, and the fourth switch are in the electrically discontinuous state.

4. The radio frequency circuit according to claim 3, wherein
the pass band of the third filter is higher in frequency than the pass band of the first filter and the pass band of the second filter.

5. The radio frequency circuit according to claim 4, wherein
the pass band of the first filter partially overlaps the pass band of the second filter in frequency.

6. The radio frequency circuit according to claim 5, further comprising:
a Digital Tunable Capacitor (DTC) connected between the one end portion of the output side coil and a connecting point of the third switch and the fourth switch.

7. The radio frequency circuit according to claim 6, further comprising:
a module board having a first principal surface and a second principal surface, the first principal surface and the second principal surface facing one another, wherein
the first switch, the second switch, the third switch, and the fourth switch are included in a semiconductor IC,
the first amplifying element, the second amplifying element, the transformer, the first filter, the second filter, and the third filter are arranged on the first principal surface, and the semiconductor IC is arranged on the second principal surface.

8. The radio frequency circuit according to claim 7, wherein the semiconductor IC includes a switch part in which the first switch, the second switch, the third switch, and the fourth switch are arranged, and a control circuit part that controls the first amplifying element and the second amplifying element, and assuming the module board is seen in planar view, at least one of the first filter and the second filter at least partially overlaps the switch part.

9. The radio frequency circuit according to claim 8, wherein the first band is Band 66 for 4G-LTE or Band n66 for 5G-NR, the second band is Band 3 for 4G-LTE or Band n3 for 5G-NR, and the third band is Band 1 for 4G-LTE or Band n1 for 5G-NR.

10. The radio frequency circuit according to claim 1, wherein assuming a signal of the third band is transmitted, the first switch is in the electrically continuous state, and the second switch, the third switch, and the fourth switch are in the electrically discontinuous state.

11. The radio frequency circuit according to claim 10, wherein the pass band of the third filter is higher in frequency than the pass band of the first filter and the pass band of the second filter.

12. The radio frequency circuit according to claim 11, wherein the pass band of the first filter partially overlaps the pass band of the second filter in frequency.

13. The radio frequency circuit according to claim 12, further comprising:

a Digital Tunable Capacitor (DTC) connected between the one end portion of the output side coil and a connecting point of the third switch and the fourth switch.

14. The radio frequency circuit according to claim 13, further comprising:

a module board having a first principal surface and a second principal surface, the first principal surface and the second principal surface facing one another, wherein the first switch, the second switch, the third switch, and the fourth switch are included in a semiconductor IC, the first amplifying element, the second amplifying element, the transformer, the first filter, the second filter, and the third filter are arranged on the first principal surface, and the semiconductor IC is arranged on the second principal surface.

15. The radio frequency circuit according to claim 14, wherein the semiconductor IC includes a switch part in which the first switch, the second switch, the third switch, and the fourth switch are arranged, and a control circuit part that controls the first amplifying element and the second amplifying element, and assuming the module board is seen in planar view, at least one of the first filter and the second filter at least partially overlaps the switch part.

16. The radio frequency circuit according to claim 15, wherein the first band is Band 66 for 4G-LTE or Band n66 for 5G-NR, the second band is Band 3 for 4G-LTE or Band n3 for 5G-NR, and the third band is Band 1 for 4G-LTE or Band n1 for 5G-NR.

17. The radio frequency circuit according to claim 2, wherein the pass band of the third filter is higher in frequency than the pass band of the first filter and the pass band of the second filter.

18. The radio frequency circuit according to claim 17, wherein the pass band of the first filter partially overlaps the pass band of the second filter in frequency.

19. The radio frequency circuit according to claim 18, further comprising:

a Digital Tunable Capacitor (DTC) connected between the one end portion of the output side coil and a connecting point of the third switch and the fourth switch;

a module board having a first principal surface and a second principal surface, the first principal surface and the second principal surface facing one another, wherein the first switch, the second switch, the third switch, and the fourth switch are included in a semiconductor IC, the first amplifying element, the second amplifying element, the transformer, the first filter, the second filter, and the third filter are arranged on the first principal surface, and the semiconductor IC is arranged on the second principal surface.

20. A communication device comprising:

a signal processing circuit that performs processing on a radio frequency signal; and the radio frequency circuit according to claim 1 that transmits the radio frequency signal between the signal processing circuit and an antenna.

* * * * *